United States Patent
Asano et al.

(10) Patent No.: US 8,963,672 B2
(45) Date of Patent: Feb. 24, 2015

(54) WIRING BOARD

(75) Inventors: Hiroaki Asano, Kariya (JP); Yasuhiro Koike, Kariya (JP); Kiminori Ozaki, Kariya (JP); Hitoshi Shimadu, Kariya (JP); Tetsuya Furuta, Kariya (JP); Masao Miyake, Kariya (JP); Takahiro Hayakawa, Ogaki (JP); Tomoaki Asai, Nagoya (JP); Ryou Yamauchi, Hashima (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 0 days.

(21) Appl. No.: 14/129,148

(22) PCT Filed: Jun. 21, 2012

(86) PCT No.: PCT/JP2012/065879
§ 371 (c)(1),
(2), (4) Date: Feb. 4, 2014

(87) PCT Pub. No.: WO2013/005576
PCT Pub. Date: Jan. 10, 2013

(65) Prior Publication Data
US 2014/0139310 A1  May 22, 2014

(30) Foreign Application Priority Data

Jul. 4, 2011 (JP) .................. 2011-148715

(51) Int. Cl.
*H01F 27/29* (2006.01)
*H01F 27/28* (2006.01)
(Continued)

(52) U.S. Cl.
CPC .................. *H05K 1/115* (2013.01); *H05K 3/20* (2013.01); *H05K 1/165* (2013.01); *H05K 1/0265* (2013.01);
(Continued)

(58) Field of Classification Search
USPC ........... 336/200, 232, 223, 192, 182; 174/266
See application file for complete search history.

(56) References Cited

U.S. PATENT DOCUMENTS

| 6,378,199 | B1 | 4/2002 | Yoshinuma et al. | |
| 2006/0175085 | A1* | 8/2006 | Lin ............................. | 174/262 |
| 2007/0279002 | A1* | 12/2007 | Partovi ....................... | 320/115 |

FOREIGN PATENT DOCUMENTS

| JP | 9-74285 | 3/1997 |
| JP | 2000-91716 | 3/2000 |

(Continued)

OTHER PUBLICATIONS

International Preliminary Report on Patentability for PCT/JP2012/065879, mailed Jan. 7, 2014.
U.S. Appl. No. 14/129,399 to Hiroaki Asano et al., filed Dec. 26, 2013.

(Continued)

*Primary Examiner* — Elvin G Enad
*Assistant Examiner* — Mangtin Lian
(74) *Attorney, Agent, or Firm* — Greenblum & Bernstein, P.L.C.

(57) ABSTRACT

This wiring board is provided with an insulating core substrate, a first conductor pattern, a second conductor pattern, and a conductive material. The first conductor pattern and the second conductor pattern are adhered to the insulating core substrate. The second conductor pattern has a first surface and a second surface. The second conductor pattern has a concavity and a through-hole. The opening of the concavity that opens to the first surface and the opening of the through hole that opens to the first surface are interconnected to each other. The first conductor pattern is positioned at the opening of the concavity. The first conductor pattern and the second conductor pattern are electrically connected by means of the conductive material, which fills from the opening of the through hole that opens to the second surface.

8 Claims, 11 Drawing Sheets

(51) Int. Cl.
*H05K 1/11* (2006.01)
*H05K 3/20* (2006.01)
*H05K 1/16* (2006.01)
*H05K 1/02* (2006.01)

(52) U.S. Cl.
CPC .......... *H05K 1/0268* (2013.01); *H01F 27/2804* (2013.01); *H05K 1/0298* (2013.01); *H05K 2201/0305* (2013.01); *H05K 2201/0391* (2013.01); *H05K 2201/0969* (2013.01); *H05K 1/118* (2013.01); *H05K 2201/09036* (2013.01); *H05K 2201/09736* (2013.01); *H05K 2201/09745* (2013.01)
USPC ............................ 336/192; 336/232; 336/182

(56) References Cited

FOREIGN PATENT DOCUMENTS

| | | |
|---|---|---|
| JP | 2004-266222 | 9/2004 |
| JP | 2005-259906 | 9/2005 |
| JP | 2006-210388 | 8/2006 |
| JP | 2009-27045 | 2/2009 |
| TW | 317692 | 10/1997 |

OTHER PUBLICATIONS

U.S. Appl. No. 14/129,408 to Hiroaki Asano et al., filed Dec. 26, 2013.
Taiwan Office action, mail date is Dec. 6, 2013.

* cited by examiner

Fig.14B

WIRING BOARD

TECHNICAL FIELD

The present invention relates to a wiring board.

BACKGROUND ART

As a technique related to a wiring board, a known technique stacks wires on a support body (for example, patent publication 1).

PRIOR ART DOCUMENT

Patent Document

Patent Document 1: Japanese Laid-Out Patent Publication No. 2000-91716

SUMMARY OF THE INVENTION

When patterned copper plates are adhered to an insulative core substrate to form a substrate, if a thin copper plate and a thick copper plate are stacked together on an insulative core substrate, a step difference is formed on the surface. In other words, when a thin copper plate is stacked on a thick copper plate, a step difference is formed on the surface of the thick copper plate for an amount corresponding to the thickness of the thin copper plate. When such a step difference is formed, the copper plate surface cannot be properly pressed during lamination pressing.

It is an object of the present invention to provide a wiring board that allows for a thin conductive pattern and a thick conductive pattern to be stacked on an insulative core substrate without forming a step difference and allows for the thin conductive pattern and the thick conductive pattern to be electrically connected.

To achieve the above object, a first aspect of the present invention is a wiring board including an insulative core substrate, a first conductive pattern, a second conductive pattern, and a conductive material. The patterned first conductive pattern is adhered to the insulative core substrate. The patterned second conductive pattern is adhered to the insulative core substrate. The second conductive pattern and the first conductive pattern are adhered to the same surface of the insulative core substrate. The second conductive pattern includes a first surface that faces toward the insulative core substrate and a second surface that is opposite to the first surface. The second conductive pattern includes a recess that opens in the first surface and a through hole that extends from the first surface to the second surface. An opening of the recess that opens in the first surface and an opening of the through hole that opens in the first surface are in communication with each other. The conductive material electrically connects the first conductive pattern and the second conductive pattern to each other. The first conductive pattern is thinner than the second conductive pattern and has a current line with a smaller cross-sectional area than that of the second conductive pattern. The first conductive pattern extends on the insulative core substrate so as to be arranged in the opening of the recess. The conductive material, which is filled into the through hole from an opening that opens in the second surface, electrically connects the first conductive pattern and the second conductive pattern.

A second aspect of the present invention is a wiring board provided with an insulative core substrate including a recess, a first conductive pattern, a second conductive pattern, and a conductive material. The patterned first conductive pattern is adhered to the insulative core substrate. The first conductive pattern includes a bent portion received in the recess. The patterned second conductive pattern is adhered to the insulative core substrate. The second conductive pattern and the first conductive pattern are adhered to the same surface of the insulative core substrate. The second conductive pattern extends to be arranged in an opening of the recess. The second conductive pattern includes a first surface that faces toward the insulative core substrate and a second surface that is opposite to the first surface. The second conductive pattern includes a through hole that extends from the first surface to the second surface. The through hole is located at a position corresponding to the recess. The conductive material electrically connects the first conductive material and the second conductive material to each other. The first conductive pattern is thinner than the second conductive pattern and has a current line with a smaller cross-sectional area than that of the second conductive pattern. The conductive material, which is filled into the through hole from an opening that opens in the second surface, electrically connects the first conductive pattern and the second conductive pattern.

A third aspect of the present invention is a wiring board including an insulative core substrate, a wiring substrate, a second conductive pattern, and a conductive material. The wiring substrate is adhered to the insulative core substrate. The wiring substrate includes a patterned first conductive pattern. The patterned second conductive pattern is adhered to the insulative core substrate. The second conductive pattern and the wiring substrate are adhered to the same surface of the insulative core substrate. The second conductive pattern includes a first surface that faces toward the insulative core substrate and a second surface that is opposite to the first surface. The second conductive pattern includes a recess that opens in the first surface and a through hole that extends from the first surface to the second surface. An opening of the recess that opens in the first surface and an opening of the through hole that opens in the first surface are in communication with each other. The conductive material electrically connects the first conductive pattern and the second conductive pattern to each other. The wiring substrate is thinner than the second conductive pattern and has a current line with a smaller cross-sectional area than that of the second conductive pattern. The first conductive pattern extends on the insulative core substrate so as to be arranged in the opening of the recess. The conductive material, which is filled into the through hole from an opening that opens in the second surface, electrically connects the first conductive pattern and the second conductive pattern.

A fourth aspect of the present invention is a wiring board provided with an insulative core substrate including a recess, a flexible wiring substrate, a second conductive pattern, and a conductive material. The flexible wiring substrate is adhered to the insulative core substrate. The flexible wiring substrate includes a patterned first conductive pattern. The flexible wiring substrate includes a bent portion received in the recess. The patterned second conductive pattern is adhered to the insulative core substrate. The second conductive pattern and the flexible wiring substrate are adhered to the same surface of the insulative core substrate. The second conductive pattern extends to be arranged in an opening of the recess. The second conductive pattern includes a first surface that faces toward the insulative core substrate and a second surface that is opposite to the first surface. The second conductive pattern includes a through hole that extends from the first surface to the second surface. The through hole is located at a position corresponding to the recess. A conductive material electrically connects the first conductive pattern and the second conductive pattern to each other. The flexible wiring substrate is thinner than the second conductive pattern and has a current line with a smaller cross-sectional area than that of the second conductive pattern. The conductive material, which is filled into the through hole from an opening that opens in the second surface, electrically connects the first conductive pattern and the second conductive pattern.

DETAILED DESCRIPTION OF THE PREFERRED EMBODIMENTS

First Embodiment

A first embodiment of the present invention will now be described with reference to the drawings.

As shown in FIGS. 1A to 3B, an electronic device 10 includes a wiring board 20. The wiring board 20 includes an insulative core substrate 30, a thin copper plate 40 adhered to one surface (upper surface) of the insulative core substrate 30 by an adhesive sheet 70, a thick copper plate 50 adhered to one surface (upper surface) of the insulative core substrate 30 by the adhesive sheet 70, and a thick copper plate 60 adhered to the other surface (lower surface) of the insulative core substrate 30.

More specifically, in the wiring board 20, the copper plate 40, which serves as a patterned thin metal plate, and the copper plate 50, which serves as a patterned thick metal plate, are adhered to the same surface of the insulative core substrate 30. Further, the thick copper plate 60, which serves as a patterned rear surface metal plate, is adhered to the surface (lower surface) of the insulative core substrate 30 opposite to the surface (upper surface) to which the thin copper plate 40 and the thick copper plate 50 are adhered.

The thin copper plate 40 has a thickness of, for example, approximately 100 μm, and the thick copper plate 50 has a thickness of, for example, approximately 400 μm. Further, the thick copper plate 60 has a thickness of, for example, approximately 400 μm. A large current may flow through the thick copper plates 50 and 60, and a small current may flow through the thin copper plate 40.

The thin copper plate 40, the thick copper plate 50, and the thick copper plate 60 are each pressed and adhered to the insulative core substrate.

Figure 1A:
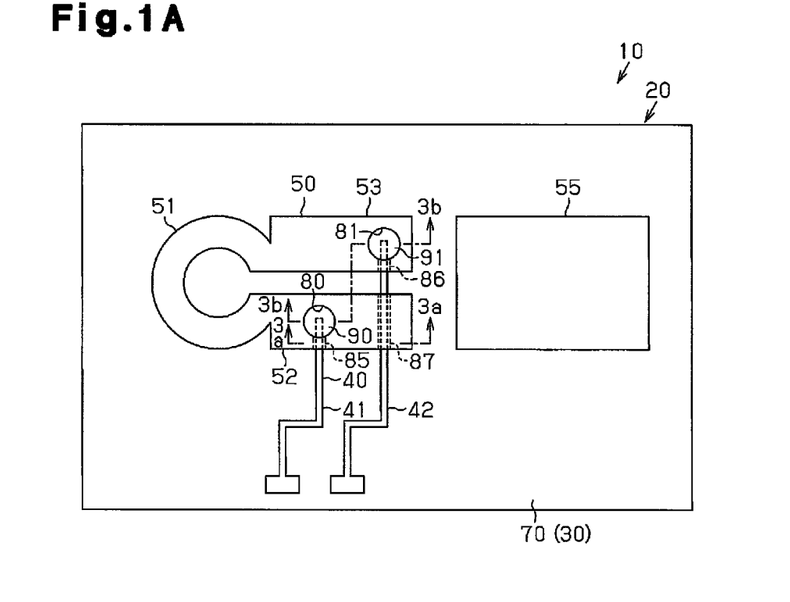
FIG. 1A is a plan view of an electronic device according to a first embodiment of the present invention.
Figure 2:
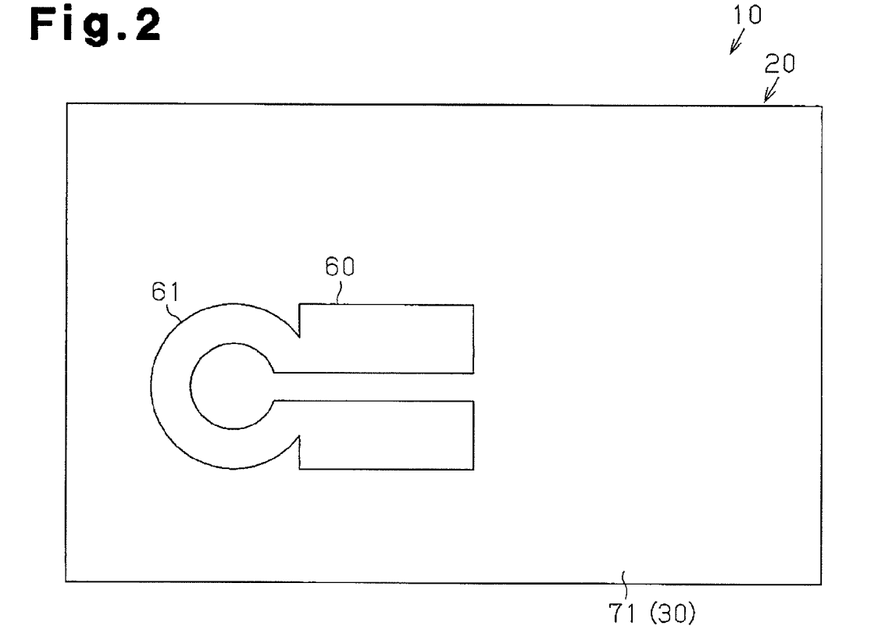
FIG. 2 is a bottom view of the electronic device shown in FIG. 1A.

As shown in FIG. 2, the thick copper plate 60 includes an annular conductive pattern 61, and the conductive pattern 61 forms a primary coil of a transformer. In the same manner, as shown in FIG. 1A, the thick copper plate 50 includes an annular conductive pattern 51, and the conductive pattern 51 forms a secondary coil of a transformer. The annular conductive pattern 61 (primary coil) and the conductive pattern 51 (secondary coil) are arranged at the same position on the two surfaces of the insulative core substrate 30.

As shown in FIG. 1A, the thick copper plate 50 includes a rectangular conductive pattern 52. The conductive pattern 52 forms a wire that extends from one end of the secondary coil of the transformer. In the same manner, the thick copper plate 50 includes a rectangular conductive pattern 53. The conductive pattern 53 forms a wire that extends from the other end of the secondary coil of the transformer.

Figure 1B:
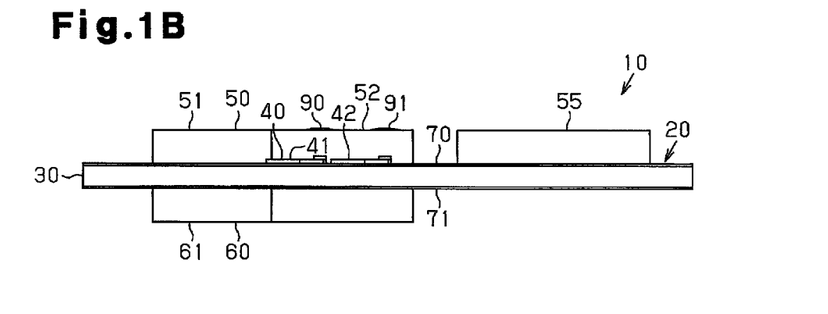
FIG. 1B is a front view of the electronic device shown in FIG. 1A.

In FIGS. 1A and 1B, reference character 55 denotes another conductive pattern of the thick copper plate 50.

As shown in FIG. 1A, the thin copper plate 40 includes a conductive pattern 41 that extends from the conductive pattern 52. Further, the thin copper plate 40 includes a conductive pattern 42 that extends from the conductive pattern 53. The conductive patterns 41 and 42 form an energizing current detection line for the secondary coil of the transformer or a voltage detection line for the secondary coil of the transformer.

In this manner, in the wiring board 20, the patterned first conductive patterns 41 and 42 and the patterned second conductive patterns 51, 52, and 53 are adhered to the same surface of the insulative core substrate 30. Further, the first conductive patterns 41 and 42 are thinner than the second conductive patterns 51, 52, and 53 and have a current line with a smaller cross-sectional area than the second conductive patterns 51, 52, and 53.

Figure 3A:
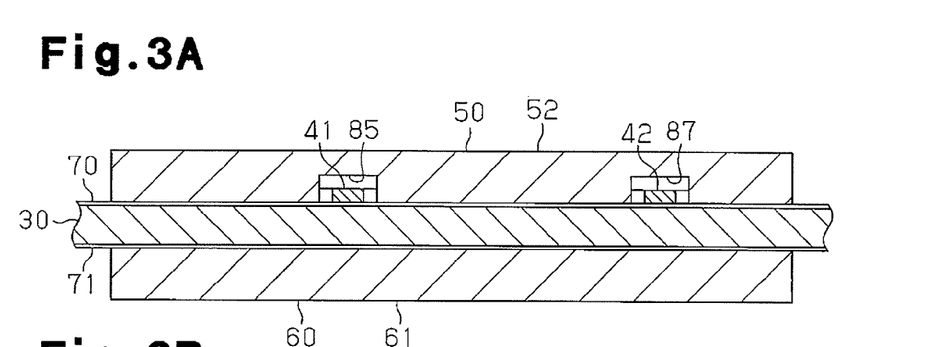
FIG. 3A is a cross-sectional view taken along line 3a-3a in FIG. 1A.
Figure 3B:
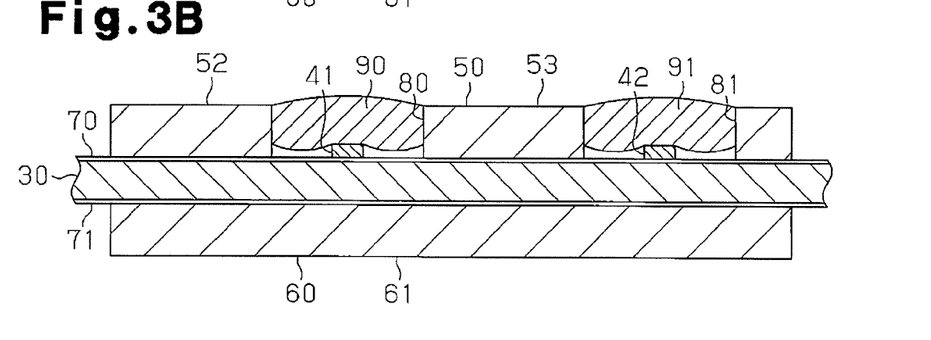
FIG. 3B is a cross-sectional view taken along line 3b-3b in FIG. 1A.
Figure 4A:
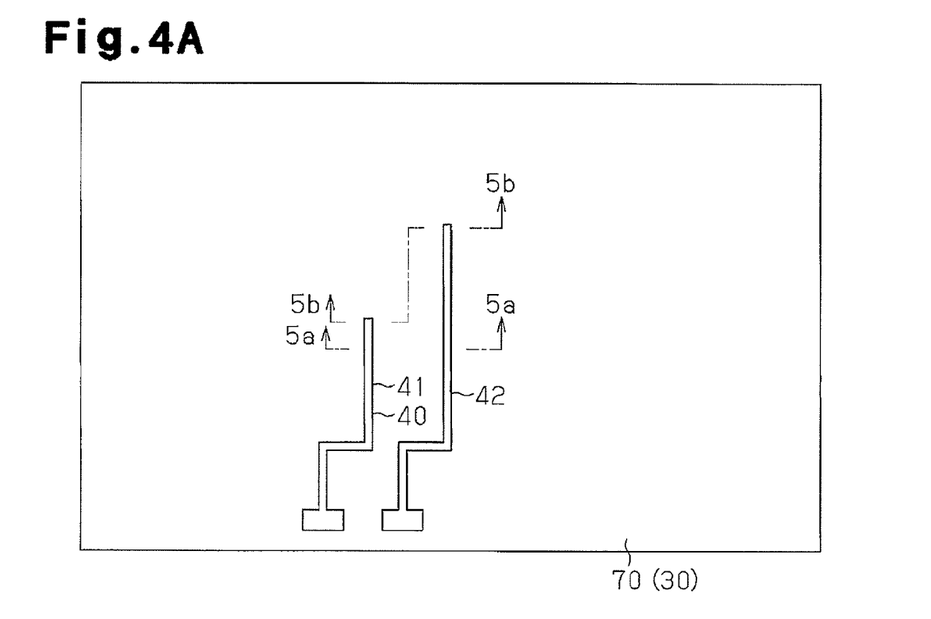
FIG. 4A is a plan view of the electronic device shown in FIG. 1A illustrating a manufacturing step.
Figure 4B:
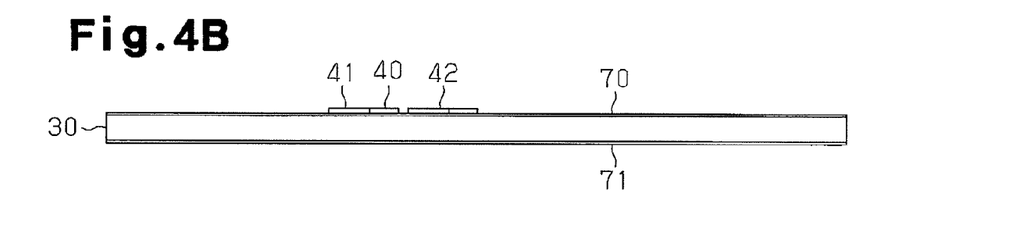
FIG. 4B is a front view of the electronic device shown in FIG. 1A illustrating a manufacturing step.
Figure 5A:
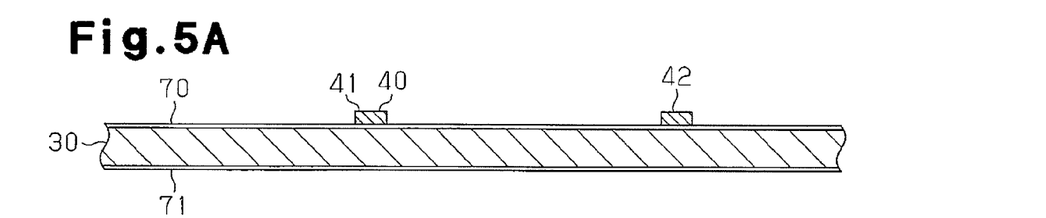
FIG. 5A is a cross-sectional view taken along line 5a-5a in FIG. 4A.
Figure 5B:
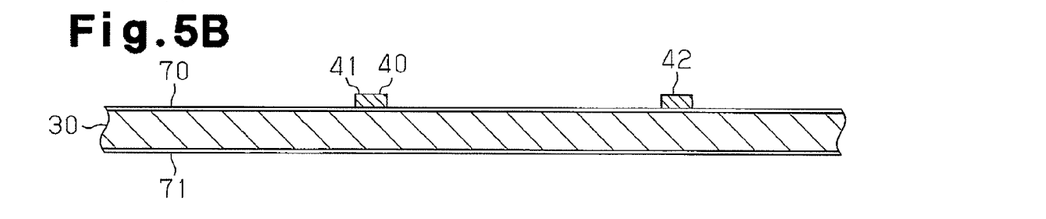
FIG. 5B is a cross-sectional view taken along line 5b-5b in FIG. 4A.
Figure 6A:
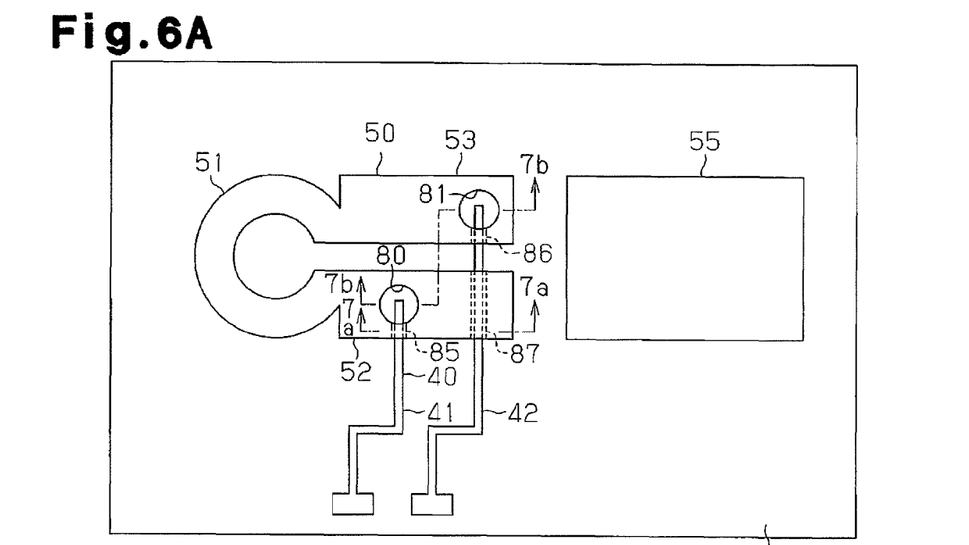
FIG. 6A is a plan view of the electronic device shown in FIG. 1A illustrating a manufacturing step.
Figure 6B:
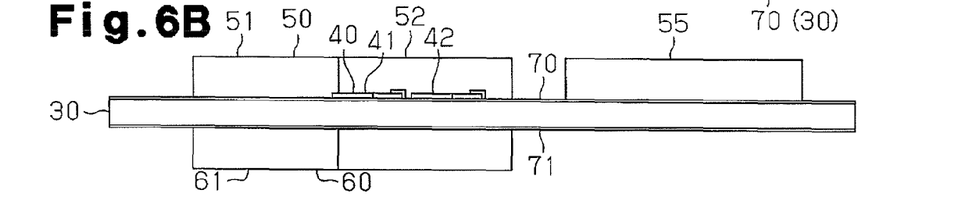
FIG. 6B is a front view of the electronic device shown in FIG. 1A illustrating a manufacturing step.
Figure 7A:
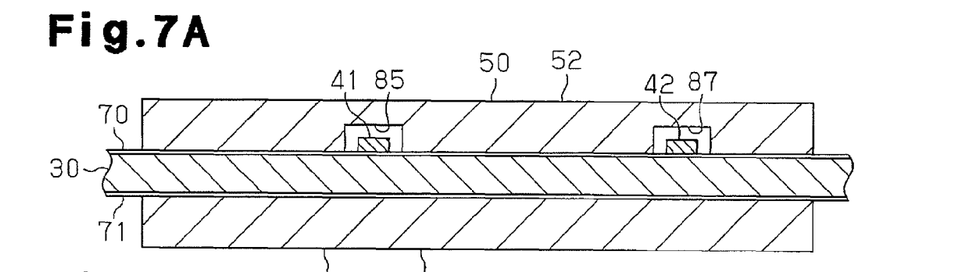
FIG. 7A is a cross-sectional view taken along line 7a-7a in FIG. 6A.
Figure 7B:
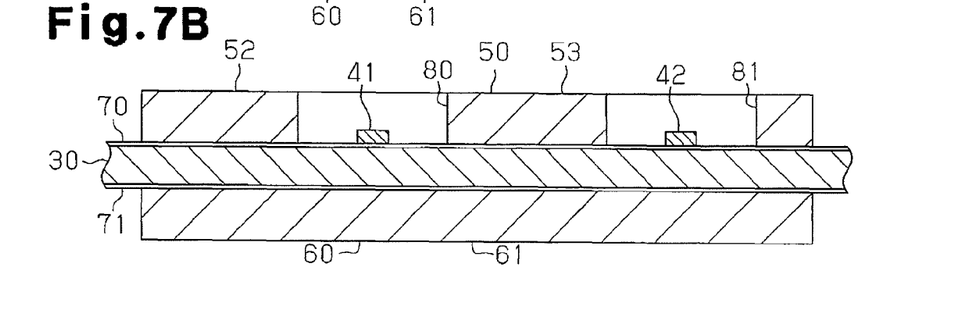
FIG. 7B is a cross-sectional view taken along line 7b-7b in FIG. 6A.

As shown in FIGS. 1A and 3B, the conductive pattern 52 includes a circular through hole 80. Further, as shown in FIGS. 1A and 3A, the conductive pattern 52 includes a recess 85. The recess 85 extends straight from one side surface of the conductive pattern 52 to the through hole 80. The recess 85 is formed so that a portion near the insulative core substrate 30 is open. In this manner, the second conductive pattern 52 includes the recess 85, which is formed so that a portion near the insulative core substrate 30 is open, and the through hole 80, which opens in a portion near the insulative core substrate 30 and a portion at the opposite side of the portion near the insulative core substrate 30. Further, the opening of the recess 85 near the insulative core substrate 30 and the opening of the through hole 80 near the insulative core substrate 30 are formed to be connected to each other.

The conductive pattern 41 is arranged in the opening of the recess 85 and the opening of the through hole 80 near the insulative core substrate 30. That is, the first conductive pattern 41 passes through the opening of the recess 85 near the insulative core substrate 30 and extends to the opening of the through hole 80 near the insulative core substrate 30. Further, as shown in FIGS. 1A and 3B, the through hole 80 is filled with solder 90, which serves as a conductive material. The solder 90 electrically connects the conductive pattern 41 of the thin copper plate 40 and the conductive pattern 52 of the thick copper plate 50. In other words, the solder 90, which serves as a conductive material filled from an opening of the through hole 80 opposite to the opening near the insulative core substrate 30, electrically connects the first conductive pattern 41 and the second conductive pattern 52.

In the same manner, the conductive pattern 53 includes a circular through hole 81. Further, the conductive pattern 53 includes a recess 86. The recess 86 extends straight from one side surface of the conductive pattern 53 to the through hole 81. The recess 86 is formed so that a portion near the insulative core substrate 30 is open. In this manner, the second conductive pattern 53 includes the recess 86, which is formed so that a portion near the insulative core substrate 30 is open, and the through hole 81, which opens in a portion near the insulative core substrate 30 and a portion at the opposite side of the portion near the insulative core substrate 30. Further, the opening of the recess 85 near the insulative core substrate 30 and the opening of the through hole 81 near the insulative core substrate 30 are formed to be connected to each other.

The conductive pattern 42 is arranged in the opening of the recess 86 and the opening of the through hole 81 near the insulative core substrate 30. That is, the first conductive pattern 42 passes through the opening of the recess 86 near the insulative core substrate 30 and extends to the opening of the through hole 81 near the insulative core substrate 30. Further, the through hole 81 is filled with solder 91, which serves as a conductive material. The solder 91 electrically connects the conductive pattern 42 of the thin copper plate 40 and the conductive pattern 53 of the thick copper plate 50. In other words, the solder 91, which serves as a conductive material filled from an opening of the through hole 81 opposite to the opening near the insulative core substrate 30, electrically connects the first conductive pattern 42 and the second conductive pattern 53.

In this manner, the conductive patterns 52 and 53 of the thick copper plate 50 for a large current are connected to the conductive patterns 41 and 42 of the thin copper plate 40 for a small current.

As shown in FIGS. 1A and 3A, the conductive pattern 52 of the thick copper plate 50 includes a recess 87. The recess extends straight from one side surface to the other side surface. The recess 87 is formed so that a portion near the insulative core substrate 30 is open. The conductive pattern 42 of the thin copper plate 40 is arranged in the opening of the recess 87 in a non-contact state.

The recesses 85, 86, and 87 may be formed by performing a pressing process on the thick copper plate 50. The depths of the recesses 85, 86, and 87 are greater than the thickness of the thin copper plate 40.

The operation of the wiring board will now be described.

As shown in FIGS. 4A to 5B, the thin copper plate 40 is adhered to the upper surface of the insulative core substrate 30 by the adhesive sheet 70 in a first pressing process. The thin copper plate 40 is patterned.

Then, as shown in FIGS. 6A to 7B, the thick copper plate 50 is adhered to the upper surface of the insulative core substrate 30 by the adhesive sheet 70 in a second pressing process. Here, the thick copper plate 50 is patterned, and the through holes 80 and 81 and the recesses 85, 86, and 87 are formed in the conductive patterns 52 and 53. Then, when the conductive pattern 41 is located in the opening of the through hole 80 and the opening of the recess 85 and the conductive pattern 42 is located in the opening of the through hole 81 and the openings of the recesses 86 and 87, the thick copper plate 50 is adhered to the upper surface of the insulative core substrate 30.

Further, the thick copper plate 60 is simultaneously adhered to the lower surface of the insulative core substrate 30 by the adhesive sheet 71 during the second pressing process. The thick copper plate 60 is patterned.

As shown in FIGS. 1A to 3B, the through holes 80 and 81 are filled with the solders 90 and 91 that serve as the conductive material. The solder 90 electrically connects the conductive pattern 41 and the conductive pattern 51. The solder 91 electrically connects the conductive pattern 42 and the conductive pattern 53.

The solders 90 and 91 may be formed (filled in the through holes 80 and 81) by directly dropping solder into the through holes 80 and 81 or by arranging a solder paste through printing in the through holes 80 and 81 and performing a reflow process.

As discussed above, the recesses 85, 86, and 87 are formed in the secondary coil pattern (conductive patterns 52 and 53) of the thick copper plate 50, and the secondary current detection conductive pattern or the voltage detection conductive pattern (conductive patterns 41 and 42) of the thin copper plate 40 are extended through the recesses 85, 86, and 87. This omits step differences from the surface.

More specifically, the conductive patterns 41 and 42 of the thin copper plate 40 are arranged in the openings of the recesses 85, 86, and 87 in the conductive patterns 52 and 53 of the thick copper plate 50. When the conductive patterns 41 and 42 of the thin copper plate 40 and the conductive patterns 52 and 53 of the thick copper plate 50 are arranged on the insulative core substrate 30, step differences are not formed in the surface of the conductive patterns 52 and 53.

Further, the conductive patterns 41 and 42 of the thin copper plate 40 are arranged in the opening of the through holes 80 and 81 in the conductive patterns 52 and 53 of the thick copper plate 50. The solders 90 and 91 filled in the through holes 80 and 81 electrically connect the conductive patterns 41 and 42 to the conductive patterns 52 and 53.

The present embodiment has the advantages described below.

(1) The second conductive patterns 52 and 53 include the recesses 85 and 86, which open in portions near the insulative core substrate 30, and the through holes 80 and 81, which open in portions near the insulative core substrate 30 and portions opposite to the portions near the insulative core substrate 30. In other words, the second conductive patterns 52 and 53 includes a first surface facing toward the insulative core substrate 30 and a second surface opposite to the first surface. The second conductive pattern includes the recesses 85 and 86, which open in the first surface, and the through holes 80 and 81, which extend from the first surface to the second surface. Further, the openings near the insulative core substrate 30 of the recesses 85 and 86 and the opening of the through holes 80 and 81 near the insulative core substrate 30 are formed to be connected to each other. In other words, the recesses 85 and 86 that open in the first surface and the openings of the through holes 80 and 81 that open in the first surface are in communication with each other. The first conductive patterns 41 and 42 are arranged to extend along portions corresponding to the recesses 85 and 86 in the insulative core substrate 30. That is, the first conductive patterns 41 and 42 are arranged in openings of the recesses 85 and 86 near the insulative core substrate 30. In other words, the first conductive patterns 41 and 42 extend on the insulative core substrate 30 to be arranged in the openings of the recesses 85 and 86. Further, the solders 90 and 91, which serve as conductive material that is filled in the through holes 80 and 81 from the openings near the insulative core substrate 30 and the opposite openings, electrically connect the first conductive patterns 41 and 42 and the second conductive patterns 52 and 53. In other words, the solders 90 and 91 filled from the openings of the through holes 80 and 81, which open in the second surface, electrically connect the first conductive patterns 41 and 42 to the second conductive patterns 52 and 53.

As a result, the thin conductive patterns 41 and 42 and the thick conductive patterns 52 and 53 may be stacked on the insulative core substrate 30 without forming step differences. This allows for the surface to be pressed during a pressing process. Further, the thin conductive patterns 41 and 42 and the thick conductive patterns 52 and 53 may be electrically connected.

In the prior art, when patterned copper plates are adhered to an insulative core substrate to form a substrate (wiring board), step differences are formed in the surface when stacking a thin copper plate and a thick copper plate on the insulative core substrate, and the copper plate surface cannot be properly pressed during lamination pressing. In contrast, the present embodiment adheres the thin copper plate 40 in the first pressing process and adheres the thick copper plates 50 and 60 in the second pressing process. This allows for electric connections to be obtained.

In the present embodiment, the first conductive patterns 41 and 42 extend on the insulative core substrate 30 from openings of the recesses 85 and 86 near the insulative core substrate 30 to openings of the through holes 80 and 81 near the insulative core substrate 30. Instead, the first conductive patterns 41 and 42 may extend on the insulative core substrate 30 from openings of the recesses 85 and 86 near the insulative core substrate 30 but not reach openings of the through holes 80 and 81 near the insulative core substrate 30. It is only necessary that the first conductive patterns 41 and 42 be arranged on the insulative core substrate 30 in openings of the recesses 85 and 86 near the insulative core substrate 30 and that the solders 90 and 91, which are filled from the openings of the through holes 80 and 81 opposite to the openings near the insulative core substrate 30, electrically connect the first conductive patterns 41 and 42 to the second conductive patterns 52 and 53.

(2) The thick copper plate 60, which serves as a patterned rear metal plate, is adhered to surface of the insulative core substrate 30 opposite to the surface to which the first conductive patterns 41 and 42 and the second conductive patterns 52 and 53 are adhered. This allows for the wiring board 20 to be a double-surface substrate.

(3) The conductive pattern 61 of the copper plate 60 forms the primary coil of the transformer, and the second conductive pattern 51 forms the secondary coil of the transformer. This allows for the transformer to be formed with coils on the two surfaces of the substrate.

(4) The first conductive patterns 41 and 42 form current or voltage detection lines in the secondary coil of the transformer. This allows for a structure that detects the current or voltage of the transformer to be easily formed.

Second Embodiment

A second embodiment will now be described focusing on differences from the first embodiment.

Figure 8A:
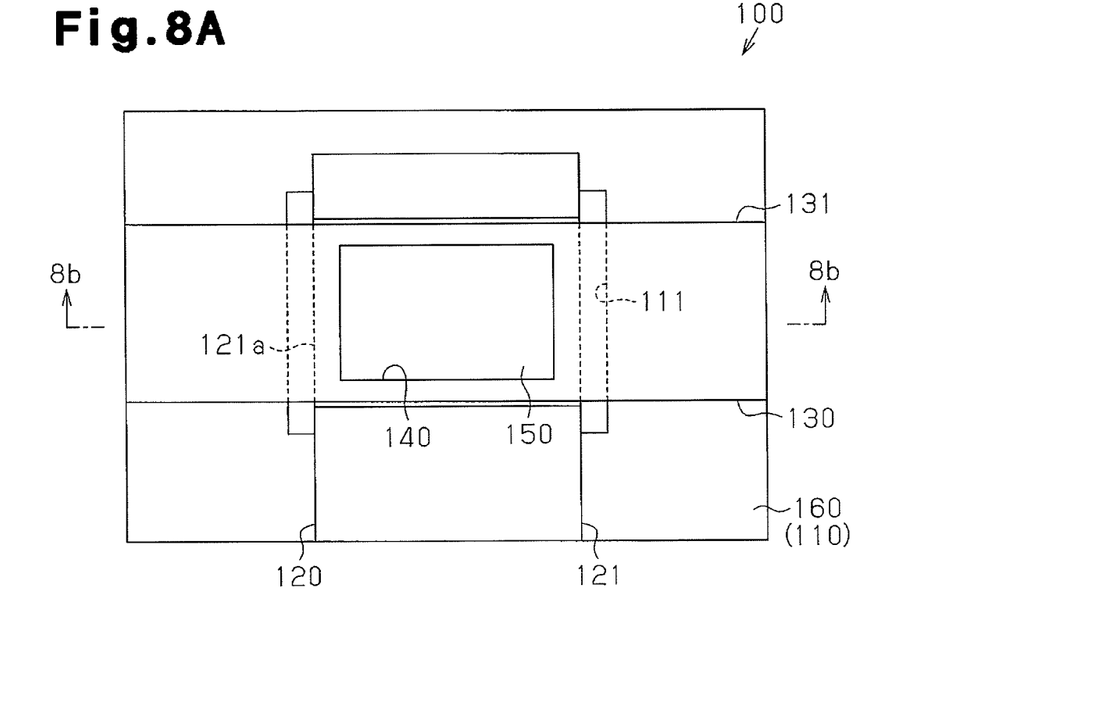
FIG. 8A is a plan view of an electronic device according to a second embodiment of the present invention.
Figure 8B:
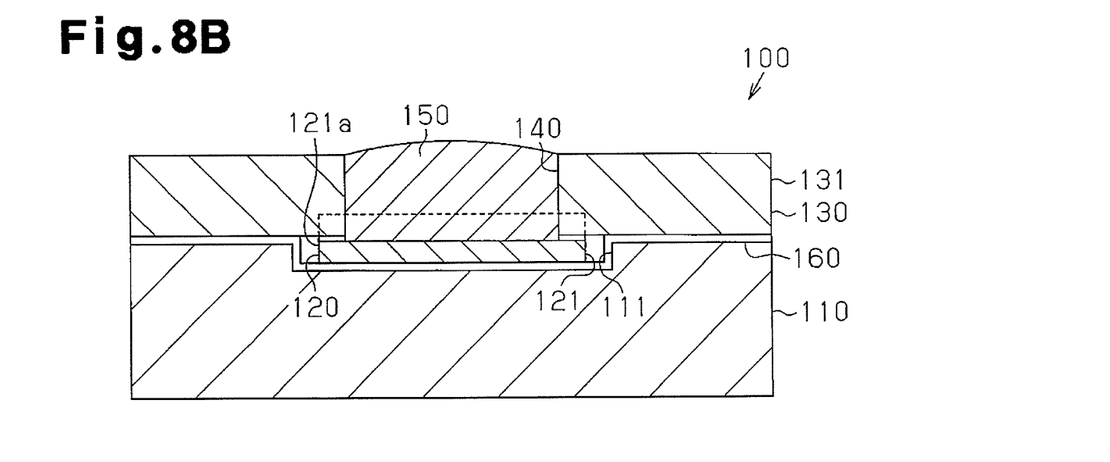
FIG. 8B is a cross-sectional view taken along line 8b-8b in FIG. 8A.

In FIGS. 1A to 3B, the insulative core substrate 30 has a flat upper surface. In the present embodiment, as shown in FIGS. 8A and 8B, a wiring board 100 is provided with an insulative core substrate 110 of which an upper surface includes a tetragonal recess 111.

In the wiring board 100, a patterned first conductive pattern 121 and a patterned second conductive pattern 131 are adhered to the insulative core substrate 110 on the same surface. The conductive pattern 121, which is formed by a thin copper plate 120 serving as a thin metal plate, extends straight with a fixed width. Further, the conductive pattern 131, which is formed by a thick copper plate 130 serving as a thick metal plate, extends straight with a fixed width.

The first conductive pattern 121 is thinner than the second conductive pattern 131 and has a current line with a smaller cross-sectional area than the second conductive pattern 131. Further, the first conductive pattern 121 includes a bent portion 121a.

The insulative core substrate 110 includes the recess 111 that receives the bent portion 121a. The recess 111 has a depth that is greater than the thickness of the thin copper plate 120.

The second conductive pattern 131 is arranged in the opening of the recess 111. A portion of the second conductive pattern 131 corresponding to the opening of the recess 111 includes a through hole 140. The through hole 140 opens in a portion near the insulative core substrate 110 and a portion opposite to the portion near the insulative core substrate 110. In other words, the second conductive pattern 131 has a first surface facing toward the insulative core substrate 110 and a second surface opposite to the first surface. The second conductive pattern 131 includes a through hole 140 extending from the first surface to the second surface. The through hole 140 is located at a position corresponding to the recess 111.

In the portion where the recess 111 is formed, the thin conductive pattern 121 and the thick conductive pattern 131 intersect each other, and the conductive pattern 121 and the conductive pattern 131 are electrically connected. That is, the solder 150, which serves as a conductive material filled from an opening of the through hole 140 opposite to the insulative core substrate 110, electrically connects the first conductive pattern 121 and the second conductive pattern 131.

As shown in FIGS. 8A and 8B, the patterned thin copper plate 120 and the patterned thick copper plate 130 are adhered by an adhesive sheet 160 to the upper surface (same surface) of the insulative core substrate 110. The thin copper plate 120 and the thick copper plate 130 are adhered to the insulative core substrate 110 in a pressing process.

A method for manufacturing the wiring board will now be described.

The manufacturing process will first be described.

Figure 9A:
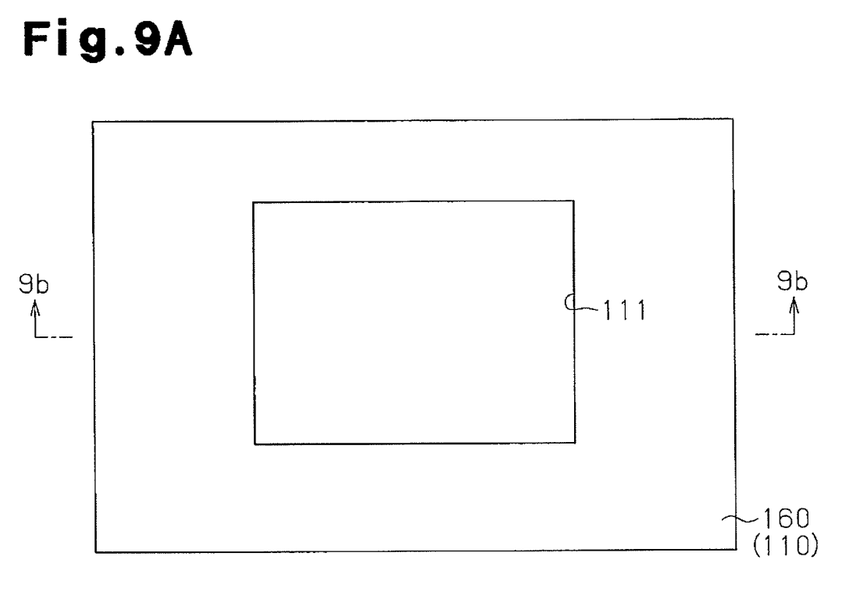
FIG. 9A is a plan view of the electronic device shown in FIG. 8A illustrating a manufacturing step.
Figure 9B:
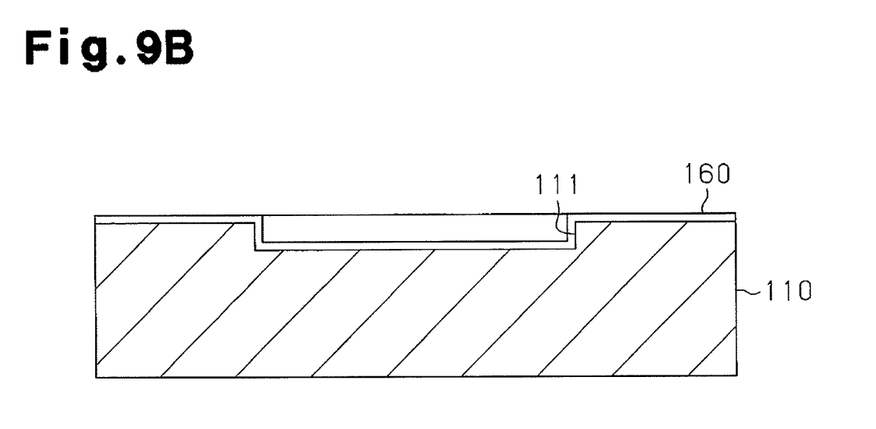
FIG. 9B is a cross-sectional view taken along line 9b-9b in FIG. 9A.
Figure 10A:
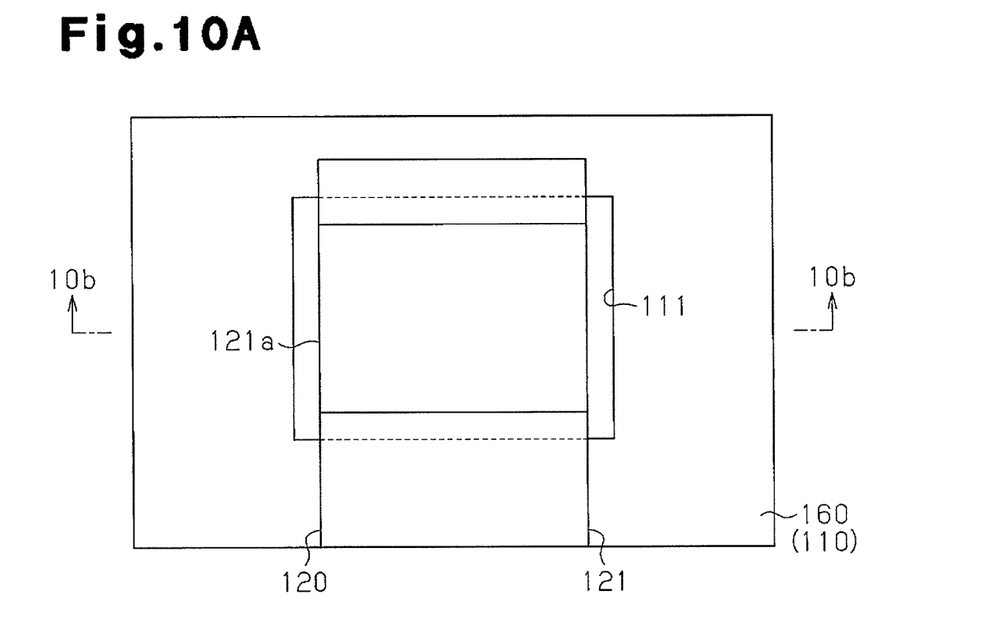
FIG. 10A is a plan view of the electronic device shown in FIG. 8A illustrating a manufacturing step.
Figure 10B:
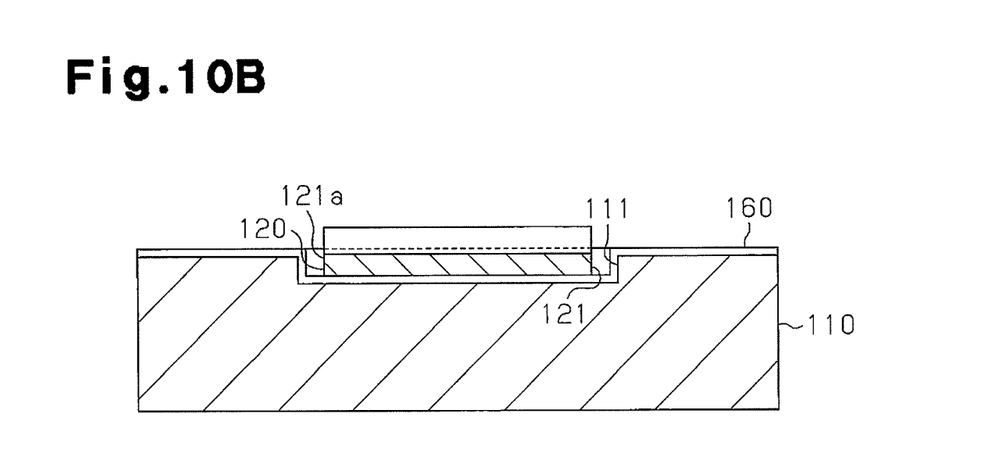
FIG. 10B is a cross-sectional view taken along line 10b-10b in FIG. 10A.

As shown in FIGS. 9A and 9B, the insulative core substrate 110 including the recess 111 in the upper surface is first prepared. As shown in FIGS. 10A and 10B, the thin copper plate 120 is adhered to the upper surface of the insulative core substrate 110 by the adhesive sheet 160 in a first pressing process. The thin copper plate 40 is adhered to the upper surface of the insulative core substrate 110 so that the conductive pattern 121 is received in the recess 111.

Figure 11A:
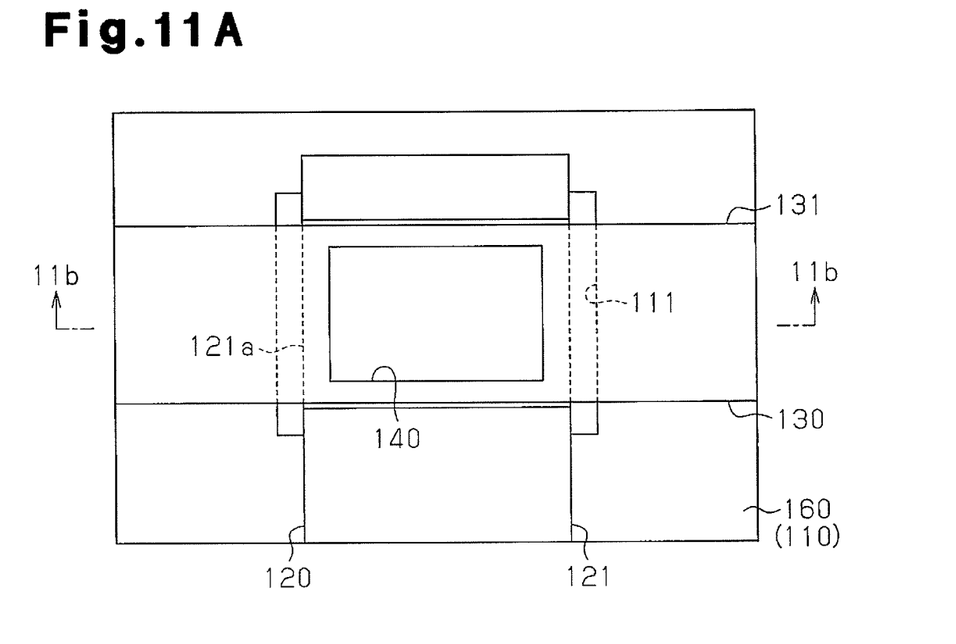
FIG. 11A is a plan view of the electronic device shown in FIG. 8A illustrating a manufacturing step.
Figure 11B:
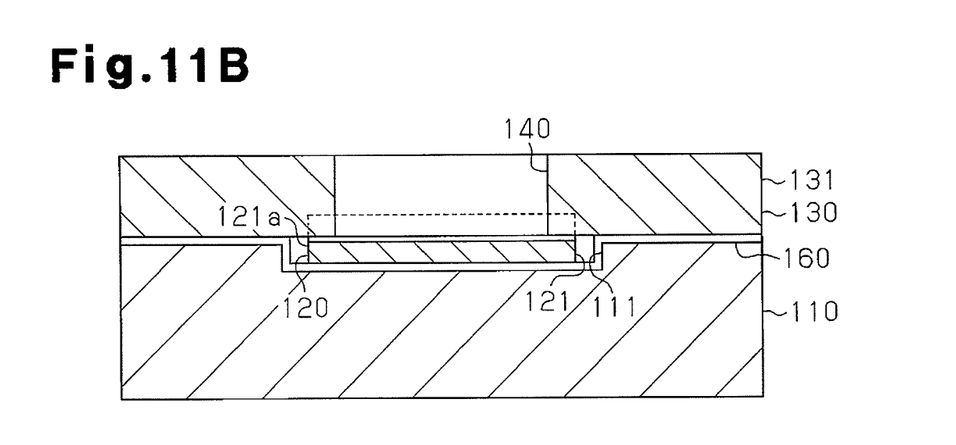
FIG. 11B is a cross-sectional view taken along line 11b-11b in FIG. 11A.

Then, as shown in FIGS. 11A and 11B, the thick copper plate 130 is adhered to the upper surface of the insulative core substrate 110 by the adhesive sheet 160 in a second pressing process. The thick copper plate 130 is patterned and includes the through hole 140. The conductive pattern 131 of the thick copper plate 130 is arranged in the opening of the recess 111, and the thick copper plate 130 is adhered to the upper surface of the insulative core substrate 110 so that the through hole 140 is located in the opening of the recess 111.

As shown in FIGS. 8A and 8B, the through hole 140 is filled with the solder 150, which serves as a conductive material. The solder 150 electrically connects the conductive pattern 121 of the thin copper plate 120 and the conductive pattern 131 of the thick copper plate 130.

In this manner, the conductive pattern 121 of the thin copper plate 120 is received in the recess 111 of the insulative core substrate 110, and the conductive pattern 121 of the thin copper plate 120 and the conductive pattern 131 of the thick copper plate 130 are stacked and arranged on the insulative core substrate 110. Here, the surface may be pressed during a pressing process without forming a step difference in the surface of the conductive pattern 131 in the thick copper plate 130. Further, the solder 150, which is filled in the through hole 140 formed in the conductive pattern 131 that is arranged in the recess 111, electrically connects the conductive pattern 121 and the conductive pattern 131.

As a result, the thin conductive pattern 121 and the thick conductive pattern 131 may be alternatively stacked and arranged on the insulative core substrate 110 without forming step differences. Further, the thin conductive pattern 121 and the thick conductive pattern 131 may be electrically connected.

The embodiments are not limited to the foregoing description and may be applied as described below.

Figure 12A:
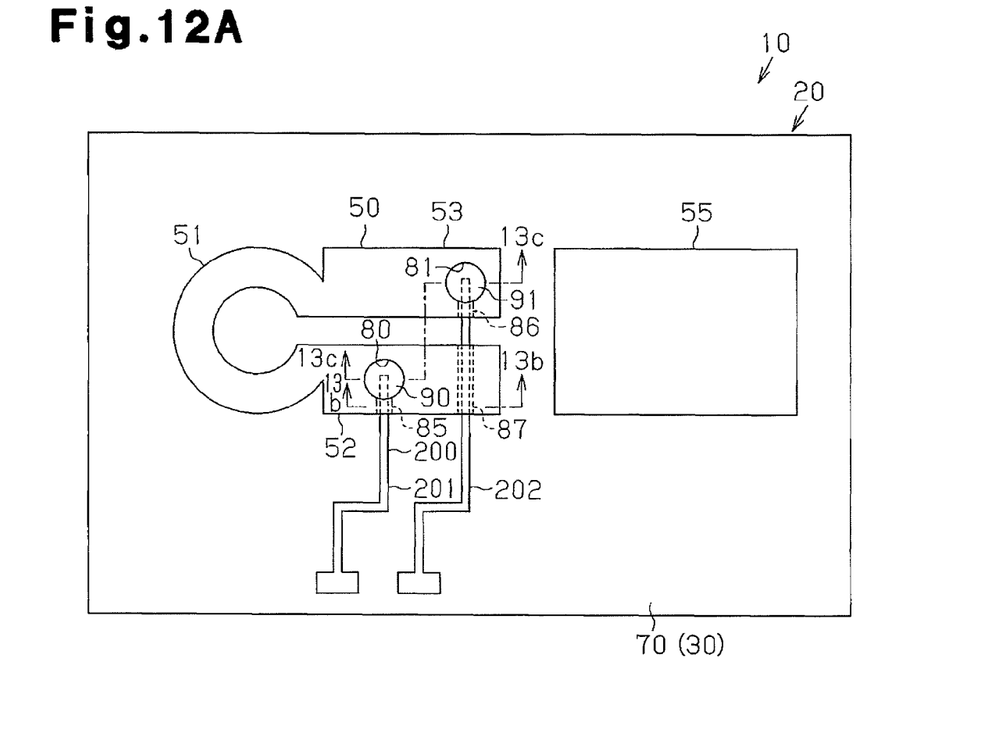
FIG. 12A is a plan view showing a further example of an electronic device.
Figure 12B:
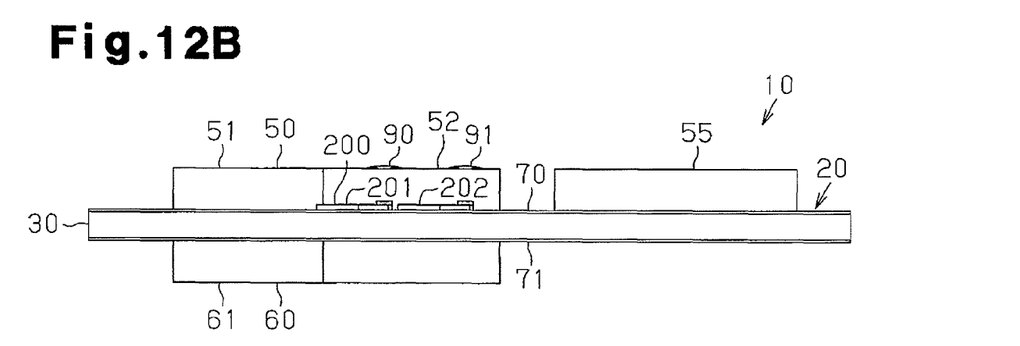
FIG. 12B is a front view of the electronic device shown in FIG. 12A.
Figure 13A:
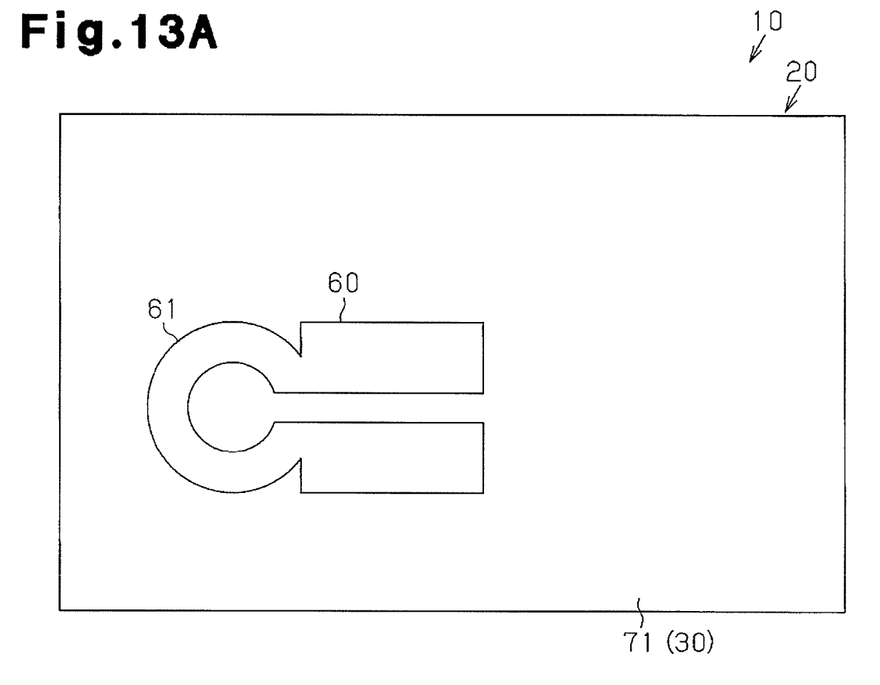
FIG. 13A is a bottom view of the electronic device shown in FIG. 12A.
Figure 13B:
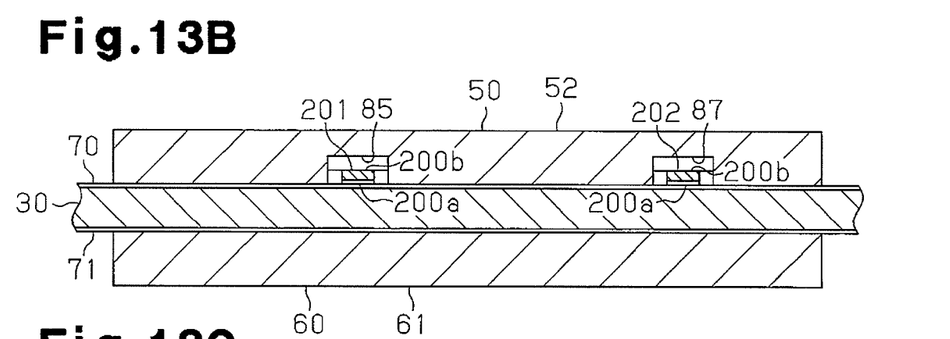
FIG. 13B is a cross-sectional view taken along line 13b-13b in FIG. 12A.
Figure 13C:
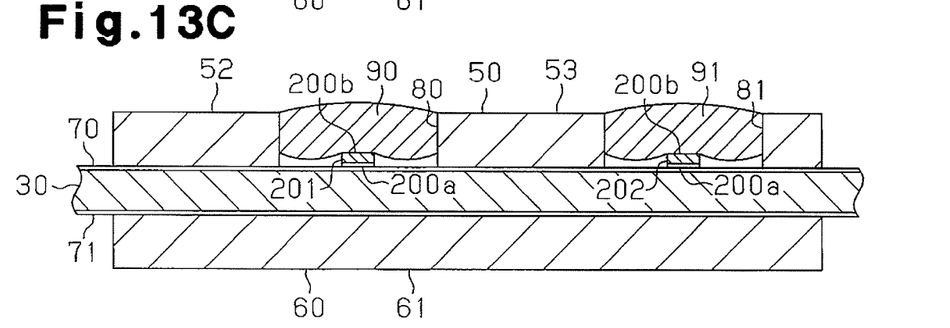
FIG. 13C is a cross-sectional view taken along line 13c-13c in FIG. 12A.

Instead of FIGS. 1A to 2, the structure shown in FIGS. 12A to 13C may be employed. As shown in FIGS. 12A and 12B, a wiring substrate 200 is used. As shown in FIGS. 13B and 13C, the wiring substrate 200 includes an insulation film 200a and a copper pattern 200b adhered onto the insulation film 200a. In the wiring board 20, a wiring substrate 200, which includes patterned first conductive patterns 201 and 202, and patterned second conductive patterns 51, 52, and 53 are adhered to the same surface of the insulative core substrate 30. The wiring substrate 200 is thinner than the second conductive patterns 51, 52, and 53 and has a current line with a smaller cross-sectional area than the second conductive patterns 51, 52, and 53. The second conductive patterns 51, 52, and 53 include recesses 85 and 86, which open in portions near the insulative core substrate 30, and through holes 80 and 81, which open in portions opposite to the portions near the insulative core substrate 30. The openings of the recesses 85 and 86 near the insulative core substrate 30 are formed to be connected to the openings of the through holes 80 and 81 near the insulative core substrate 30. The first conductive patterns 201 and 202 extend on the insulative core substrate 30 through the openings of the recesses 85 and 86 near the insulative core substrate 30 to the openings of the through holes 80 and 81 near the insulative core substrate 30. In broad terms, the first conductive patterns 201 and 202 are arranged on the insulative core substrate 30 in the openings of the recesses 85 and 86 near the insulative core substrate 30. In this case, step differences are not formed in the surfaces of the thick second conductive patterns 51, 52, and 53. The solders 90 and 91, which serve as a conductive material filled into the through holes 80 and 81 from openings opposite the openings near the insulative core substrate 30, electrically connect the first conductive patterns 201 and 202 to the second conductive patterns 52 and 53.

In this manner, the thin conductive patterns 201 and 202 and the thick conductive patterns 52 and 53 may be stacked and arranged on the insulative core substrate 30 without forming step differences. Further, the thin conductive patterns 201 and 202 may be electrically connected to the thick conductive patterns 52 and 53.

Figure 14A:
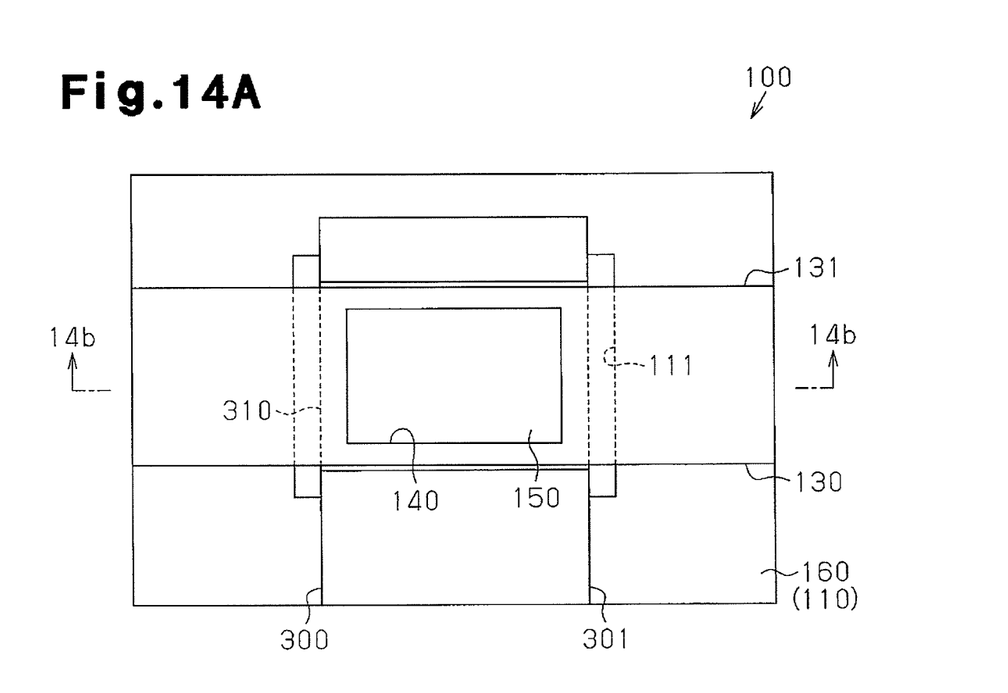
FIG. 14A is a plan view showing a further example of an electronic device.
Figure 14B:
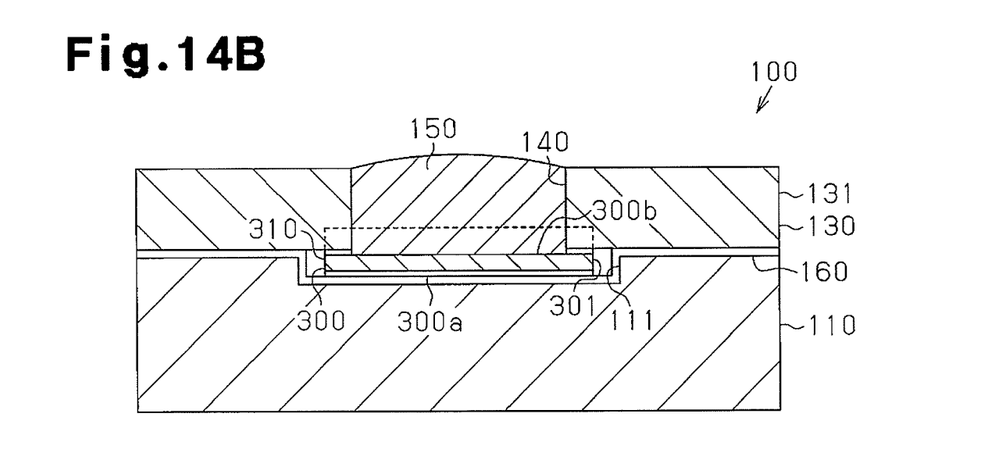
FIG. 14B is a cross-sectional view taken along line 14b-14b in FIG. 14A.

Instead of FIGS. 8A and 8B, the structure shown in FIGS. 14A and 14B may be employed. As shown in FIGS. 14A and 14B, a flexible wiring substrate 300 is used. The flexible wiring substrate 300 includes an insulation film 300a and a copper pattern 300b, which is adhered onto the insulation film 300a. In a wiring board 100, the flexible wiring substrate 300, which includes a patterned first conductive pattern 301, and a patterned second conductive pattern 131 are adhered to the same surface of the insulative core substrate 110. The flexible wiring substrate 300 is thinner than the second conductive pattern 131 and has a current line with a smaller cross-sectional area than the second conductive pattern 131. The flexible wiring substrate 300 includes a bent portion 310. The insulative core substrate 110 includes the recess 111 that receives the bent portion 310. The second conductive pattern 131 is arranged in the opening of the recess 111. A portion of the second conductive pattern 131 corresponding to the opening of the recess 111 in the second conductive pattern 131 includes a through hole 140. The through hole 140 opens in a portion near the insulative core substrate 110 and a portion opposite to the portion near the insulative core substrate 110. Step differences are not formed in the surface of the second conductive pattern 131. Solder 150, which serves as a conductive material filled into the through hole 140 from an opening opposite to the insulative core substrate 110, electrically connects the first conductive pattern 301 and the second conductive pattern 131.

In this manner, the thin conductive pattern 301 and the thick conductive pattern 131 may be stacked and arranged on the insulative core substrate 110 without forming step differences. Further, the thin conductive pattern 301 and the thick conductive pattern 131 may be electrically connected.

Copper plates (40, 50, 60, 120, 130, etc.) are used as the metal plates. However, other metal plates such as aluminum plates may be used as the metal plates. Preferably, soldered regions undergo a plating process when using aluminum plates.

Solder (90, 91, and 150) is used as the conductive material. Instead, other metals having low melting points may be used.

The invention claimed is:
1. A wiring board comprising:
an insulative core substrate;
a patterned first conductive pattern adhered to the insulative core substrate;
a patterned second conductive pattern adhered to the insulative core substrate, wherein the second conductive pattern and the first conductive pattern are adhered to the same surface of the insulative core substrate, the second conductive pattern includes a first surface that faces toward the insulative core substrate and a second surface that is opposite to the first surface, the second conductive pattern includes a recess that opens in the first surface and a through hole that extends from the first surface to the second surface, and an opening of the recess that opens in the first surface and an opening of the through hole that opens in the first surface are in communication with each other; and a conductive material that electrically connects the first conductive pattern and the second conductive pattern to each other, wherein the first conductive pattern is thinner than the second conductive pattern and has a current line with a smaller cross-sectional area than that of the second conductive pattern, and the first conductive pattern extends on the insulative core substrate so as to be arranged in the opening of the recess, and the conductive material, which is filled into the through hole from an opening that opens in the second surface, electrically connects the first conductive pattern and the second conductive pattern.

2. The wiring board according to claim 1, wherein a patterned rear metal plate is adhered to a surface of the insulative core substrate opposite to the surface to which the first conductive pattern and the second conductive pattern are adhered.

3. The wiring board according to claim 2, wherein a conductive pattern of the rear metal plate forms a primary coil of a transformer, and the second conductive pattern forms a secondary coil of the transformer.

4. The wiring board according to claim 3, wherein the first conductive pattern forms a current or voltage detection line in the secondary coil of the transformer.

5. A wiring board comprising:
an insulative core substrate;
a wiring substrate adhered to the insulative core substrate, wherein the wiring substrate includes a patterned first conductive pattern;
a patterned second conductive pattern adhered to the insulative core substrate, wherein the second conductive pattern and the wiring substrate are adhered to the same surface of the insulative core substrate, the second conductive pattern includes a first surface that faces toward the insulative core substrate and a second surface that is opposite to the first surface, the second conductive pattern includes a recess that opens in the first surface and a through hole that extends from the first surface to the second surface, and an opening of the recess that opens in the first surface and an opening of the through hole that opens in the first surface are in communication with each other; and a conductive material that electrically connects the first conductive pattern and the second conductive pattern to each other, wherein the wiring substrate is thinner than the second conductive pattern and has a current line with a smaller cross-sectional area than that of the second conductive pattern, and the first conductive pattern extends on the insulative core substrate so as to be arranged in the opening of the recess, and the conductive material, which is filled into the through hole from an opening that opens in the second surface, electrically connects the first conductive pattern and the second conductive pattern.

6. The wiring board according to claim 5, wherein a patterned rear metal plate is adhered to a surface of the insulative core substrate opposite to the surface to which the first conductive pattern and the second conductive pattern are adhered.

7. The wiring board according to claim 6, wherein a conductive pattern of the rear metal plate forms a primary coil of a transformer, and the second conductive pattern forms a secondary coil of the transformer.

8. The wiring board according to claim 7, wherein the first conductive pattern forms a current or voltage detection line in the secondary coil of the transformer.

* * * * *